US012791604B2

(12) United States Patent
Chen et al.

(10) Patent No.: US 12,791,604 B2
(45) Date of Patent: Nov. 10, 2026

(54) SEGMENTED TESTING METHOD FOR FUNCTIONAL SAFETY TESTING CIRCUIT, ELECTRONIC DEVICE, AND STORAGE MEDIUM

(71) Applicant: VeriSilicon Microelectronics (Shanghai) Co., Ltd., Shanghai (CN)

(72) Inventors: Xiaoying Chen, Shanghai (CN); Huiming Zhang, Shanghai (CN); Kui Qin, Shanghai (CN); Cheng Chi, Shanghai (CN); Jianbing Wu, Shanghai (CN)

(73) Assignee: VeriSilicon Microelectronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/567,783

(22) PCT Filed: Dec. 29, 2022

(86) PCT No.: PCT/CN2022/143479
§ 371 (c)(1),
(2) Date: Dec. 7, 2023

(87) PCT Pub. No.: WO2024/138545
PCT Pub. Date: Jul. 4, 2024

(65) Prior Publication Data
US 2026/0169060 A1 Jun. 18, 2026

(51) Int. Cl.
*G01R 31/28* (2006.01)
*G06F 11/07* (2006.01)
(Continued)

(52) U.S. Cl.
CPC ..... *G01R 31/2815* (2013.01); *G01R 31/2803* (2013.01); *G01R 31/2837* (2013.01);
(Continued)

(58) Field of Classification Search
CPC ............ G01R 31/2815; G01R 31/2837; G01R 31/2803; G01R 31/281; G01R 31/2836;
(Continued)

(56) References Cited

U.S. PATENT DOCUMENTS 11,681,596 B1 * 6/2023 Engelkemier ....... G06F 11/1048 714/37
2015/0234760 A1 * 8/2015 Kimura .............. G06F 11/0766 710/110

* cited by examiner

*Primary Examiner* — Douglas X Rodriguez
*Assistant Examiner* — Kendrick X Liu
(74) *Attorney, Agent, or Firm* — IPRTOP LLC

(57) ABSTRACT

A segmented testing method for a functional safety testing circuit, an electronic device, and a storage medium are provided. The segmented testing method comprises: analyzing a circuit architecture of the functional safety testing circuit, and determining coverage paths of circuits that require functional safety protection; splitting the functional safety testing circuit to obtain two or more segmented circuits based on the coverage paths; testing each of the segmented circuits to obtain a circuit testing result by using a preset testing mechanism; and determining a functional safety error of the functional safety testing circuit based on the circuit testing result. The above method can be used for end-to-end circuit functional safety protection, thereby reducing the requirements of the system when data is transmitted from the sending terminal to the receiving terminal, and further reducing the complexity of the functional safety system.

18 Claims, 5 Drawing Sheets

(51) Int. Cl.
*G06F 11/263* (2006.01)
*G06F 11/27* (2006.01)

(52) U.S. Cl.
CPC .......... *G01R 31/2884* (2013.01); *G06F 11/07* (2013.01); *G06F 11/263* (2013.01); *G06F 11/27* (2013.01)

(58) Field of Classification Search
CPC ............ G01R 31/2884; G01R 31/2801; G01R 31/2831; G01R 31/2851; G06F 11/263; G06F 11/27; G06F 11/26; G06F 11/07
See application file for complete search history.

SEGMENTED TESTING METHOD FOR FUNCTIONAL SAFETY TESTING CIRCUIT, ELECTRONIC DEVICE, AND STORAGE MEDIUM

FIELD OF TECHNOLOGY

The present disclosure belongs to the technical field of functional safety, and relates to a testing method. Particularly, the present disclosure relates to a segmented testing method for a functional safety testing circuit, an electronic device, and a storage medium.

BACKGROUND

Currently, with the rapid development of electronic products, electronic systems, such as automotive systems, have become increasingly complex. This leads to a significant increase in the probability of electronic and electrical faults in their circuits.

When faults occur in the circuits, it can have serious implications for the overall safety of the system. In the case of automotive systems, such faults can impact the safe operation of the vehicle, resulting in abnormal vehicle behavior and potential harm to personal safety. Therefore, it is crucial to enhance the reliability and functional safety of various electronic systems, particularly automotive electronic systems. To ensure the functional safety of these systems, functional safety testing plays a vital role.

Hardware-based functional safety testing circuits are often adopted due to their higher real-time performance and reliability. However, different technical solutions for such circuits present various challenges, including increased costs and issues related to real-time performance and stability. Addressing these challenges is a key focus in the field of functional safety.

SUMMARY

The present disclosure provides a segmented testing method for a functional safety testing circuit, an electronic device, and a storage medium to address the challenge of balancing low cost with both real-time performance and stability of the system during the functional safety testing process.

A first aspect of the present disclosure provides a segmented testing method for a functional safety testing circuit. The segmented testing method comprises: analyzing a circuit architecture of the functional safety testing circuit, and determining coverage paths of circuits that require functional safety protection; splitting the functional safety testing circuit to obtain two or more segmented circuits based on the coverage paths; testing each of the segmented circuits to obtain a circuit testing result by using a preset testing mechanism; and determining a functional safety error of the functional safety testing circuit based on the circuit testing result.

In an embodiment of the first aspect, splitting the functional safety testing circuit to obtain two or more segmented circuits based on the coverage paths comprises: splitting the functional safety testing circuit by adopting one or more of a rule for module boundaries, a rule for data changes, or a rule for reducing a complexity of implementing the functional safety testing circuit, based on the coverage paths.

In an embodiment of the first aspect, when the functional safety testing circuit is split by adopting the rule for module boundaries based on the coverage paths, the rule for module boundaries comprises a boundary of each submodule of modules and a module group consisting of the modules in the circuits that require functional safety protection.

In an embodiment of the first aspect, adopting the rule for module boundaries comprises one or more of: in an Static Random-Access Memory (SRAM) memory provided inside a module, configuring a submodule of the SRAM memory as a starting point and a testing point of a functional safety splitting path; in a top-level input interface and a top-level output interface of an Semiconductor intellectual property core (IP) circuit, configuring the top-level input interface such that it corresponds to an earliest receiving terminal of the IP circuit, and configuring the earliest receiving terminal such that it is protected by the functional safety testing circuit and acts as a starting point of a functional safety protection circuit; configuring the top-level output interface such that it corresponds to an output sending terminal of the IP circuit, and configuring the output sending terminal such that it is protected by the functional safety testing circuit and acts as an ending point of the functional safety protection circuit; in an System on Chip (SoC) system where the IP circuit is provided, configuring an input interface and output interface of each IP core in the SoC system such that they act as a starting point or an ending point of the functional safety splitting path.

In an embodiment of the first aspect, when the functional safety testing circuit is split by adopting the rule for data changes based on the coverage paths, the rule for data changes comprises a change of data that requires functional safety protection and a change of verification data corresponding to the data that requires functional safety protection; the change of the data that requires functional safety protection comprises: a content change of the data and an increase or decrease in numbers of the data that requires functional safety protection when the data passes through an operation path; the change of the verification data comprises a change of a verification polynomial and a change of a verification algorithm.

In an embodiment of the first aspect, when the functional safety testing circuit is split by adopting the rule for reducing the complexity of implementing the functional safety testing circuit based on the coverage paths, the complexity of implementing the functional safety testing circuit comprises difficulties of transmitting an ideal checksum value from a starting point of a functional safety testing path of the functional safety testing circuit and then comparing the ideal checksum value at a testing point of the functional safety testing path.

In an embodiment of the first aspect, analyzing the circuit architecture of the functional safety testing circuit and determining coverage paths of circuits that require functional safety protection comprises: analyzing the circuit architecture of the functional safety testing circuit, and determining the coverage paths of circuits that require functional safety protection based on a functional safety target to be reached by the functional safety testing circuit, wherein each circuit that requires functional safety protection comprises a control pathway and a data pathway.

In an embodiment of the first aspect, determining the functional safety error of the functional safety testing circuit based on the circuit testing result comprises: collecting the circuit testing result of each segmented circuit; and determining the functional safety error of the functional safety testing circuit based on the circuit testing result of each segmented circuit.

A second aspect of the present disclosure provides an electronic device, comprising a processor and a memory, wherein the memory is configured to store a computer program, and the processor is configured to execute the computer program stored in the memory, so that the electronic device executes the segmented testing method.

A third aspect of the present disclosure provides a non-transitory computer-readable storage medium, configured to store a computer program, wherein the segmented testing method is implemented when the computer program is executed by a processor.

A fourth aspect of the present disclosure provides a functional safety testing circuit, wherein the segmented testing method is applied for testing.

In an embodiment of the fourth aspect, the functional safety testing circuit comprises a bus control module, a register parsing module, and a data processing module; wherein a configuration pathway that requires functional safety protection is connected to the bus control module, wherein the bus control module is configured to perform a bus interface protocol and transmit configuration information of the configuration pathway to the register parsing module to obtain parsed information of a register, and the register parsing module then sends the parsed information of a register to the data processing module to be processed by the data processing module, wherein a final use position of the register is configured as a testing point of a functional safety testing path.

In an embodiment of the fourth aspect, the functional safety testing circuit comprises a plurality of data reading modules, an arbitration module, a data decompression module, a data reordering/deinterleaving processing module, a bus interface conversion module, a compression state management module and a storage address mapping module; in a data request pathway, the data reading modules generate multiple data read requests and send the multiple data read requests to the arbitration module, the arbitration module chooses one request from the multiple data read requests and sends the chosen request to the compression state management module, the compression state management module sends the chosen request to the storage address mapping module after querying a data compression state corresponding to the chosen request, and the storage address mapping module maps an original virtual request address to a physical storage address to obtain a mapped physical storage address and a mapped request; wherein the mapped physical storage address and mapped request are sent to the bus interface conversion module for performing the bus interface protocol and a cross-clock domain conversion, and then sent to a bus; in a data return pathway, after the cross-clock domain conversion through the bus interface conversion module, data reaches the data reordering/deinterleaving processing module to be reordered and compressed, the compressed data is transmitted to the data decompression module to be decompressed and restored and then transmitted to the arbitration module, and finally returned to the data reading modules; wherein a functional safety protection path that requires functional safety protection adopts a functional safety testing mechanism in a manner of cyclic redundancy check to protect a request bus.

In another embodiment of the fourth aspect, the functional safety testing circuit comprises a SoC system provided with multiple IP circuits, the SoC system comprises a display controller, an image processor, a central processor, a bus interconnection control module, and a memory; wherein the IP circuits comprise two or more data pathways, and image data generated by the central processor and image data generated by the image processor are respectively transmitted to the display controller through the data pathways.

As described above, the segmented testing method for functional safety testing circuits, the electronic device, and the storage medium of the present disclosure have the following beneficial effects:

The present disclosure proposes the above segmented testing method for hardware-based functional safety testing circuits. This method involves splitting a functional safety testing circuit that requires functional safety protection to obtain two or more segmented circuits. Each of the segmented circuits adopts an independent functional safety testing mechanism to deform or expand the data that needs to be protected, thereby enhancing implementation flexibility. It not only satisfies the circuit coverage requirements of Automotive Safety Integrity Level (ASIL), but also offers simplicity, flexibility, and high efficiency in terms of modifications. Moreover, the segmented testing method can be used for end-to-end circuit functional safety protection, thereby reducing the requirements of the system when the data is transmitted from the sending terminal to the receiving terminal, and further reducing the complexity of the functional safety system. The present disclosure can be widely applied to electronic systems with high requirements on functional safety protection, such as automotive systems.

REFERENCE NUMERALS

Figure 1:
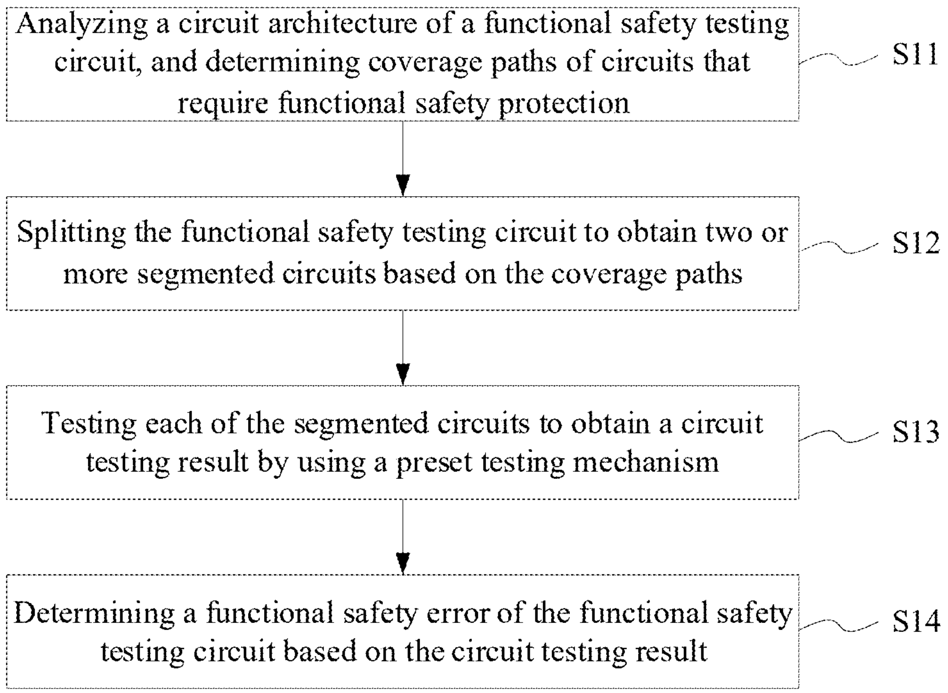
FIG. 1 shows a flowchart illustrating a segmented testing method for a functional safety testing circuit according to an embodiment of the present disclosure.

10 Top-level module, which adopts a segmented testing method to achieve a functional safety testing circuit in an embodiment
101 Bus control module
102 Register parsing module
103 Data Processing Module
20 Top-level module, which adopts a segmented testing method to achieve a functional safety testing circuit in another embodiment
201 Data reading module
202 Arbitration module
203 Data decompression module
204 Data reordering/deinterleaving processing module
205 Bus interface conversion module
206 Compression state management module
207 Storage address mapping module
Fusa1 Functional safety testing path 1, which requires functional safety protection
Fusa2 Functional safety testing path 2, which requires functional safety protection Fusa3 Functional safety testing path 3, which requires functional safety protection
Fusa1_*p*1 to p3 Functional safety splitting paths, which are obtained by splitting the functional safety testing path 1 via a segmented testing method
Fusa2_*p*1 to p3 Functional safety splitting paths, which are obtained by splitting the functional safety testing path 2 via a segmented testing method
Fusa3_*p*1 to p3 Functional safety splitting paths, which are obtained by splitting the functional safety testing path 3 via a segmented testing method
30 Top-level module, which adopts a segmented testing method to achieve a functional safety testing circuit in another embodiment
301 Display controller
302 Image processor
303 Central processor
304 Bus interconnection control module
305 Memory
6 Electronic device
61 Processor
62 Memory
63 Communication interface
64 System bus
S11 to S14 Various steps
S21 to S25 Various steps

DETAILED DESCRIPTION

The embodiments of the present disclosure will be described below through specific examples. Those skilled can easily understand other advantages and effects of the present disclosure from the disclosure of the present specification. The present disclosure can also be implemented or applied through other different specific embodiments. Various details in this specification can also be modified or changed based on different viewpoints and disclosures without departing from the spirit of the present disclosure. It should be noted that the following embodiments and the features of the following embodiments can be combined with each other if no conflict will result.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the layout of the components can also be more complicated.

The inventors are aware that ISO 26262, taking the automotive safety field as an example, stipulates international standards for improving the functional safety of automotive electronic products, and specifies different functional safety ASIL levels. For safety levels ASIL B and above, the single-point error coverage of circuit diagnosis is required to be above 90%. When a hardware testing circuit or a testing system combining software and hardware reaches the single-point error coverage of circuit diagnosis corresponding to the ASIL level, the testing circuit or system is proved to meet functional safety standards.

The inventors are also aware that functional safety testing is crucial to meeting the different levels of requirements specified by ASIL, so as to ensure the functional safety of automotive electronic systems. Those skilled will preferentially consider hardware-based functional safety testing circuits due to their higher real-time performance and reliability requirements. Regarding hardware-based functional safety testing circuits, in order to enable hardware to reach a coverage rate of more than 90% of that required by ASIL B, a first technical solution involves large-scale replication of modules within the hardware, resulting in an approximately twofold increase in chip area supporting functional safety testing circuits, thereby significantly increasing costs. A second technical solution involves analyzing hardware circuits and developing customized functional safety testing circuits, which introduces complex control circuits, affects normal functional circuits, increases systematic risks. In addition, the customized functional safety testing circuits have a relatively low transferability. To address these issues, a third technical solution is proposed and combines software and hardware to achieve the coverage rate required. Compared with pure hardware testing circuits, the third approach has worse real-time performance and system stability. Therefore, reducing costs while improving real-time performance and stability of the system has become a key focus in the field of functional safety.

The present disclosure will be described in further detail below with reference to the accompanying drawings.

FIG. 1 shows a flowchart illustrating a segmented testing method for a functional safety testing circuit according to an embodiment of the present disclosure. As shown in FIG. 1, the segmented testing method comprises steps S11-S14.

S11: analyzing a circuit architecture of a functional safety testing circuit, and determining coverage paths of circuits that require functional safety protection.

In an embodiment, S11 comprises: analyzing the circuit architecture of the functional safety testing circuit, and determining the coverage paths of circuits that require functional safety protection based on a functional safety target to be reached by the functional safety testing circuit, wherein each circuit that requires functional safety protection comprises a control pathway and a data pathway.

S12: splitting the functional safety testing circuit to obtain two or more segmented circuits based on the coverage paths.

Specifically, the number of paths of segmented circuits, also called functional safety splitting paths, is greater than or equal to that of original paths of the functional safety testing circuit. The functional safety testing circuit has one original path, and therefore the number of the functional safety splitting paths is a positive integer greater than or equal to one.

In an embodiment, S12 comprises: splitting the functional safety testing circuit by adopting one or more of: a rule for module boundaries, a rule for data changes, or a rule for reducing a complexity of implementing the functional safety testing circuit, based on the coverage paths. Each of the segmented circuits, that is, each functional safety splitting path, may adopt one or more of the above rules, respectively.

It should be noted that the functional safety testing circuit, also called original circuit, comprises one or more paths that require functional safety protection. For ease of description, the paths that require functional safety protection are named as functional safety protection paths. The segmented testing method used for functional safety testing can be used in each of the functional safety protection paths in the functional safety testing circuit.

It should also be noted that the rules in S12 may be independent of each other, partially overlapping, or completely overlapping. For example, the functional safety splitting paths may adopt any one or more of: the rule for module boundaries, the rule for data changes, or the rule for reducing the complexity of implementing the functional safety testing circuit.

In an embodiment, when the functional safety testing circuit is split by adopting the rule for module boundaries based on the coverage paths, the rule for module boundaries entails a boundary of each submodule of modules and a module group consisting of the modules in the circuits that require functional safety protection.

In an embodiment, adopting the rule for module boundaries comprises one or more of:

(1) for an SRAM memory provided inside a module, configuring a submodule of the SRAM memory as a starting point and a testing point of a functional safety splitting path. Here, the module boundaries further entail the module group consisting of the modules in the circuits that require functional safety protection.

(2) for a top-level input interface and a top-level output interface of an IP circuit, configuring the top-level input interface such that it corresponds to an earliest receiving terminal of the IP circuit, and configuring the earliest receiving terminal such that it is protected by the functional safety testing circuit and acts as a starting point of a functional safety protection circuit; configuring the top-level output interface such that it corresponds to an output sending terminal of the IP circuit, and configuring the output sending terminal such that it is protected by the functional safety testing circuit and acts as an ending point of the functional safety protection circuit. Here, the rule for module boundaries also entails a module group consisting of modules in an IP core.

The IP core is generally referred as IP in the field of chips. An IP core refers to a circuit module with an independent function in the chip, which also has a mature design and can be applied to other chips having the same circuit module, thereby reducing the design workload, shortening the design period, and improving the success rate of chip design.

(3) in an SoC (System on Chip) system where the IP circuit is provided, configuring an input interface and output interface of each IP core in the SoC system such that they act as a starting point or an ending point of the functional safety splitting path. It should be noted that the module boundaries in the rule for module boundaries may entail a module group consisting of one or more modules.

In an embodiment, when the functional safety testing circuit is split by adopting the rule for data changes based on the coverage paths, the data changes comprise a change of data that requires functional safety protection and a change of verification data corresponding to the data that requires functional safety protection.

Specifically, the change of the data that requires functional safety protection comprises: a content change of the data and an increase or decrease in numbers of the data that requires functional safety protection when the data passes through an operation path. For example, the data that requires functional safety protection may change from data A to data A and data B. The change of the verification data comprises a change of a verification polynomial and a change of a verification algorithm.

In an embodiment, when the functional safety testing circuit is split by adopting the rule for reducing the complexity of implementing the functional safety testing circuit based on the coverage paths, the complexity of implementing the functional safety testing circuit comprises difficulties of transmitting an ideal checksum value from a starting point of a functional safety testing path (i.e., the original path) and then comparing the ideal checksum value with an actual checksum value at a testing point of the functional safety testing path.

S13: testing each of the segmented circuits to obtain a circuit testing result by using a preset testing mechanism.

S14: determining a functional safety error of the functional safety testing circuit based on the circuit testing result.

In an embodiment, S14 comprises: collecting the circuit testing result of each segmented circuit; and determining the functional safety error of the functional safety testing circuit based on the circuit testing result of each segmented circuit.

Specifically, the functional safety testing path is split into multiple functional safety splitting paths, and a total number of the multiple functional safety splitting paths of the functional safety protection circuit is set to K. The errors of K functional safety splitting paths are collected and combined to generate a final functional safety error interrupt signal.

In an embodiment, the segmented testing method, after S14, further comprises S15:

applying the segmented testing method to other paths that require functional safety protection based on the methods and rules of S12 to S14, and ending segmentation processes if there are no more functional safety protection circuits that require splitting.

It should be noted that the functional safety testing circuit comprises one or more functional safety protection paths, and the segmented testing method can be used for the functional safety protection paths in the functional safety testing circuit, individually, or in combination.

It should also be noted that the starting point and a final testing point of each functional safety protection path may not correspond to those of the functional safety splitting paths.

Thus, the functional safety testing circuit implemented by the segmented testing method not only provides the same coverage rate for each of the functional safety protection circuits, which simplifies the design complexity greatly, but also loosens data pathway requirements between different IP circuits within a system.

Figure 2:
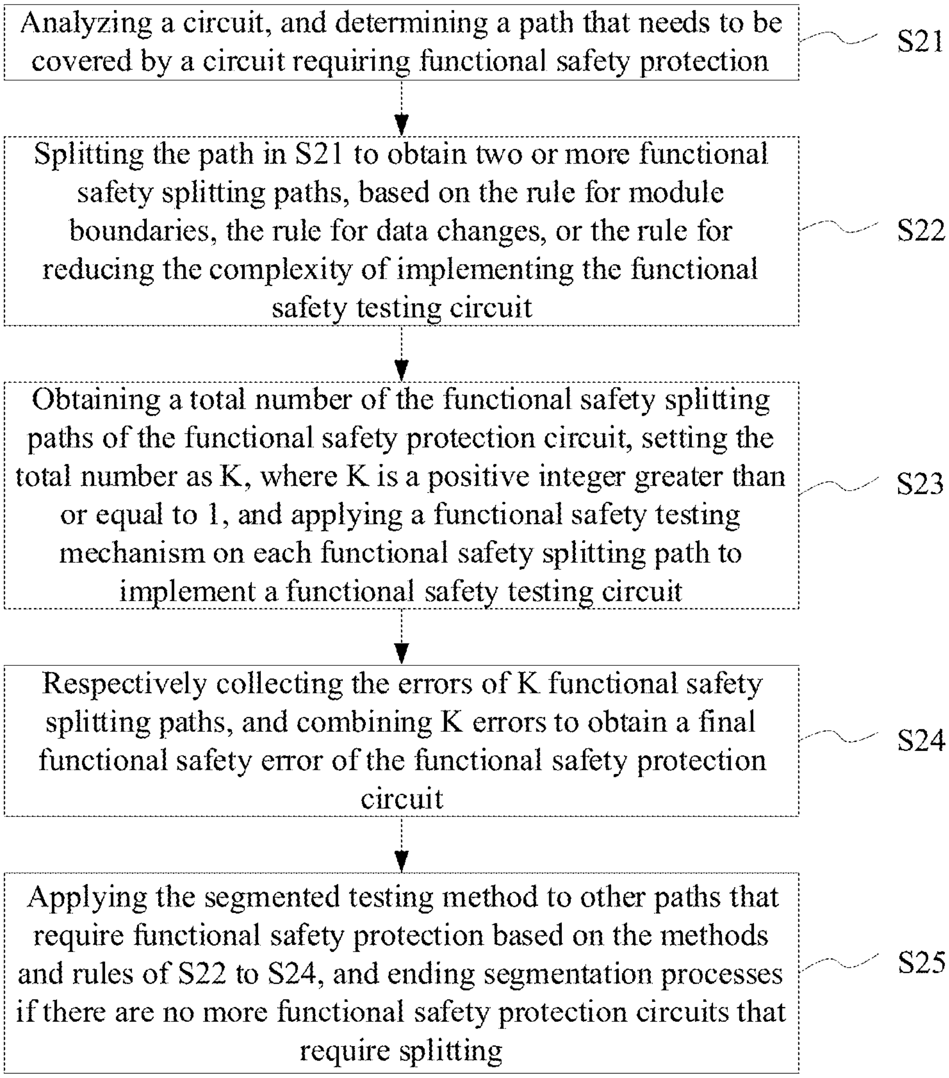
FIG. 2 shows a flowchart illustrating a segmented testing method for a functional safety testing circuit according to another embodiment of the present disclosure.

FIG. 2 shows a flowchart illustrating a segmented testing method for a functional safety testing circuit according to another embodiment of the present disclosure. As shown in FIG. 2, steps of applying the segmented testing method to multiple functional safety splitting paths are shown.

S21: analyzing a circuit, and determining a path that needs to be covered by a circuit requiring functional safety protection.

S22: splitting the path in S21 to obtain two or more functional safety splitting paths, based on the rule for module boundaries, the rule for data changes, or the rule for reducing the complexity of implementing the functional safety testing circuit.

S23: obtaining a total number of the functional safety splitting paths of the functional safety protection circuit, setting the total number as K, where K is a positive integer greater than or equal to 1, and applying a functional safety testing mechanism on each functional safety splitting path to implement a functional safety testing circuit.

S24: respectively collecting the errors of K functional safety splitting paths, and combining K errors to obtain a final functional safety error of the functional safety protection circuit.

S25: applying the segmented testing method to other paths that require functional safety protection based on the methods and rules of S22 to S24, and ending segmentation processes if there are no more functional safety protection circuits that require splitting.

Hereinafter, the circuits in FIG. 3 and FIG. 4 will be described in conjunction with S21 to S25 shown in FIG. 2. For details, please refer to steps A1 to A5 regarding FIG. 3 and steps B1 to B5 regarding FIG. 4.

Figure 3:
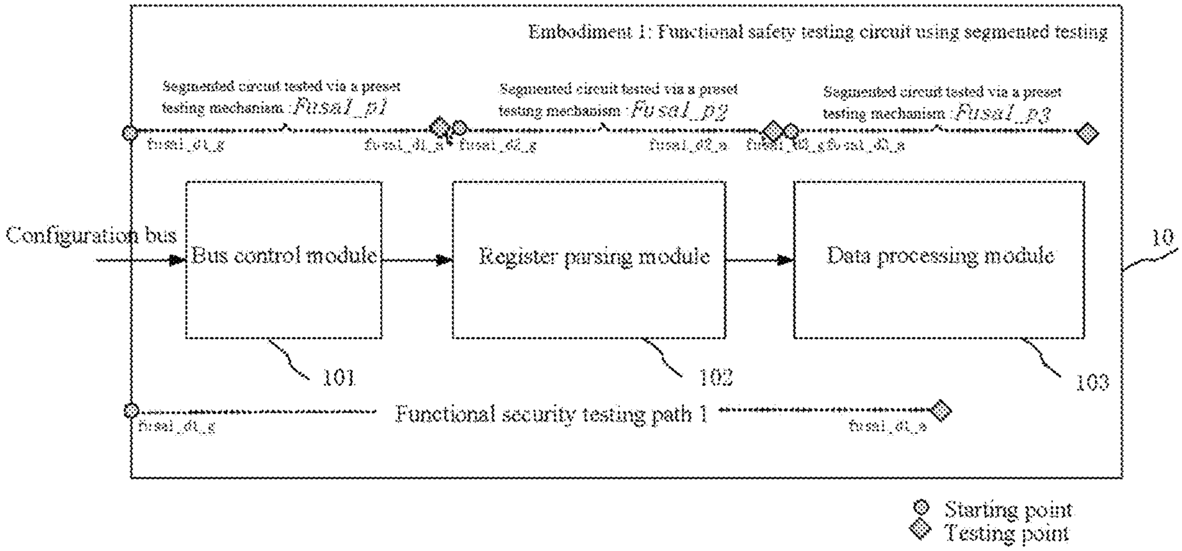
FIG. 3 shows a schematic circuit diagram of a segmented testing method for a functional safety testing circuit according to an embodiment of the present disclosure.

FIG. 3 shows a schematic circuit diagram of a segmented testing method for a functional safety testing circuit according to an embodiment of the present disclosure. As shown in FIG. 3, the segmented testing method comprises steps A1-A5:

A1: analyzing a circuit, and determining a path that needs to be covered by a circuit requiring functional safety protection.

In an embodiment, as shown in FIG. 3, a configuration pathway/bus that requires functional safety protection is connected to an input interface of a top-level module 10. The configuration pathway/bus is first connected to a bus control module 101, which performs a bus interface protocol and transmits configuration information of the configuration pathway to a register parsing module 102 to obtain parsed information of a register. The register parsing module 102 then sends the parsed information to a data processing module 103 to be processed by the data processing module 103. A final use position of the register is a testing point of a functional safety testing path 1 that requires functional safety protection, as shown in FIG. 3. The functional safety testing path 1 adopts a functional safety testing mechanism in a parity check mode to protect a configuration bus, compares a checksum value of actual data (or actual checksum value) with a checksum value of ideal data (or ideal checksum value) at the testing point of the functional safety testing path 1, and reports a functional safety error of the functional safety testing path 1 if the two are not consistent. In the implementation process, an ideal checksum value fusa1_*d*1_*g* of the functional safety testing path 1 is calculated based on actual data obtained at a starting point of the functional safety testing path 1, that is, the input interface of the top-level module 10. Fusa1_*d*1_*g* needs to be transmitted, together with an original data timing, to a testing point of the functional safety testing path 1, that is, the data processing module 103. The actual data reaching the testing point of the functional safety testing path 1 is encoded to obtain an actual checksum value fusa1_*d*1_*a*. Comparing fusa1_*d*1_*g* and fusa1_*d*1_*a* at the testing point, and reporting the functional safety error of the functional safety testing path 1 if the two are not consistent.

A2: splitting the path in A1 to obtain two or more functional safety splitting paths, based on the rule for module boundaries, the rule for data changes, or the rule for reducing the complexity of implementing the functional safety testing circuit.

In an embodiment, as shown in FIG. 3, fusa1_*d*1_*g* is transmitted from the input interface of the top-level module 10 to the data processing module 103 for comparison. This process relates to interface changes among different modules, requires data content of the functional safety testing path 1 that requires functional safety protection to remain unchanged, and requires the functional safety testing mechanism adopted by the functional safety testing path 1 to remain unchanged, thereby greatly reducing the implementation flexibility. The segmented testing method of the present disclosure splits, based on the rule for module boundaries, the functional safety testing path 1 into three functional safety splitting paths, named as first functional safety splitting path Fusa1_*p*1, second functional safety splitting path Fusa1_*p*2, and third functional safety splitting path Fusa1_*p*3, respectively.

A3: obtaining the total number K of the functional safety splitting paths of the functional safety protection circuit, where K is a positive integer greater than or equal to 1, and separately applying the functional safety testing mechanism on each functional safety splitting path to implement the functional safety testing circuit.

Specifically, a starting point of Fusa1_*p*1 is located at the input interface of the top-level module 10, that is, Fusa1_*p*1 and the functional safety testing path 1 have one common starting point, as shown in FIG. 3. A testing point of Fusa1_*p*1 is located at an input interface of the register parsing module 102. An ideal checksum value fusa1_*d*1_*g* of Fusa1_*p*1 is calculated based on actual data obtained at the starting point of the functional safety testing path 1. The actual data reaching the input interface of the register parsing module 102 is encoded to obtain an actual checksum value fusa1_*d*1_*a* of the testing point of Fusa1_*p*1. After comparing fusa1_*d*1_*g* and fusa1_*d*1_*a* at the testing point, fusa1_*d*1_*g* is released, while fusa1_*d*1_*g* of the functional safety testing path 1 will be transmitted until reaching a final testing point of the functional safety testing path 1.

Specifically, a starting point of Fusa1_*p*2 is located at the input interface of the register parsing module 102, and a testing point of Fusa1_*p*2 is located at an input interface of the data processing module 103. An ideal checksum value fusa1_*d*2_*g* of Fusa1_*p*2 is calculated based on the actual data obtained at the input interface of the register parsing module 102. It should be noted that fusa1_*d*2_*g* of Fusa1_*p*2 is only used for internal testing, and this ideal checksum value may be deformed or extended. For example, more data may be merged for protection. Specifically, an address may be merged with the corresponding data, and then encoded together; the functional safety testing mechanism of Fusa1_*p*2 may also be changed and is completely independent of Fusa1_*p*1, thereby improving the flexibility of check and the simplicity of operation.

Specifically, a starting point of Fusa1_*p*3 is located at the input interface of the data processing module 103, and a testing point of Fusa1_*p*2 is located at an output interface of the data processing module 103. It should be noted that the starting point and the final testing point of each functional safety protection path may not correspond to those of the corresponding functional safety splitting path. In the top-level module 10, a circuit behind the testing point of the functional safety testing path 1 within the data processing module 103 also requires functional safety protection, and in Fusa1_*p*3, the two paths that require functional safety protection are merged.

More specifically, an ideal checksum value fusa1_*d*3_*g* of Fusa1_*p*3 is calculated based on the actual data obtained at the starting point of Fusa1_*p*3, and then the actual data reaching the testing point of Fusa1_*p*3 is encoded to obtain an actual checksum value fusa1_*d*3_*a* of Fusa1_*p*3. Comparing fusa1_*d*3_*g* and fusa1_*d*3_*a* at the testing point. Similarly, fusa1_*d*3_*g* of Fusa1_*p*3 is only used for internal testing, and this ideal checksum value may also be deformed or extended. For example, more data may be encoded, and the functional safety testing mechanism of Fusa1_*p*3 may also be changed. The method is consistent with that of Fusa1_*p*2.

A4: collecting the errors of K functional safety splitting paths, respectively, and combining the K errors to obtain the final functional safety error of the functional safety protection circuit. The essence of the functional safety testing lies in the timely detection and reporting of errors, and therefore the error of each functional safety splitting path needs to be collected and merged into a final functional safety error interrupt signal. In an embodiment of the present disclosure, the errors of Fusa1_p1, Fusa1_p2 and Fusa1_p3 are Fusa1_e1, Fusa1_e2 and Fusa1_e3, respectively. These three errors need to be collected, merged, and eventually reported to the final functional safety error interrupt signal of the entire system.

A5: applying the segmented testing method to other paths that require functional safety protection based on the methods and rules of A2 to A4, and ending segmentation processes if there are no more functional safety protection circuits that require splitting.

Therefore, the single-point error coverage of circuit diagnosis adopting the above segmented testing method is consistent with that of the functional safety testing path 1, while greatly reducing the implementation complexity and improving the implementation flexibility.

Figure 4:
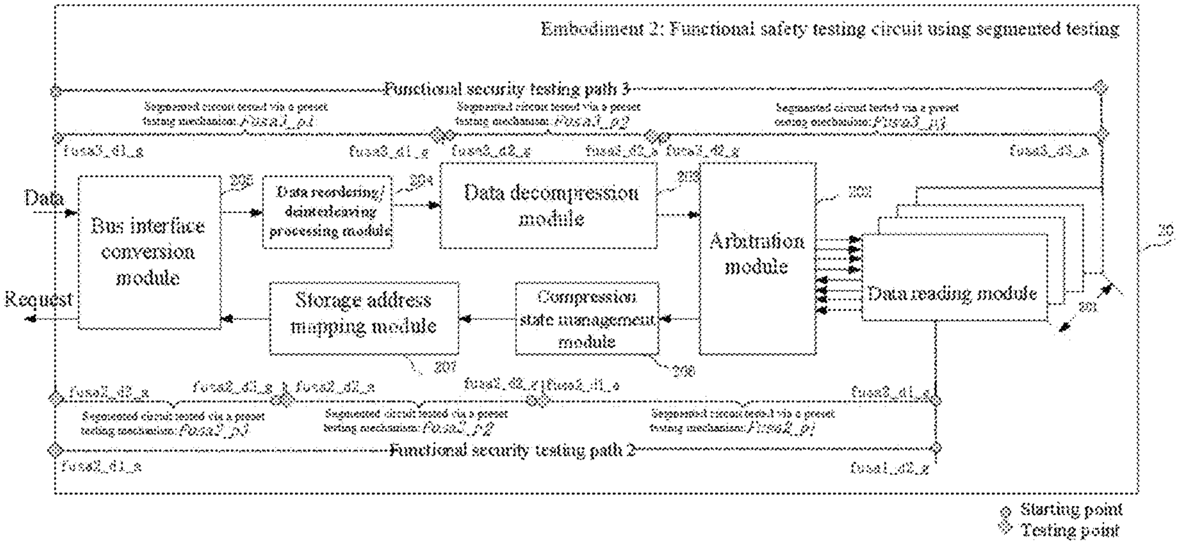
FIG. 4 shows a schematic circuit diagram of a segmented testing method for a functional safety testing circuit according to another embodiment of the present disclosure.

FIG. 4 shows a schematic circuit diagram of a segmented testing method for a functional safety testing circuit according to another embodiment of the present disclosure, in order to better clarify the idea of the present disclosure. In this specific embodiment, the rule for data changes is adopted. Specifically, the segmented testing method comprises steps B1-B5:

B1: analyzing a circuit, and determining a path that needs to be covered by a circuit requiring functional safety protection. As shown in FIG. 4, a functional safety testing path 2 is a data request pathway. A plurality of data reading modules 201 generate multiple data read requests, and send the multiple data read requests to an arbitration module 202. The arbitration module 202 chooses one request from the multiple data read requests and sends the chosen request to a compression state management module 206. The compression state management module 206 sends the chosen request to a storage address mapping module 207 after querying a data compression state corresponding to the chosen request. The storage address mapping module 207 maps an original virtual request address to a physical storage address to obtain a mapped physical storage address and a mapped request. The mapped physical storage address and mapped request are sent to a bus interface conversion module 205 for performing a bus interface protocol and a cross-clock domain conversion, and then sent to a bus. The functional safety testing path 2 adopts a functional safety testing mechanism in a parity check mode to protect a request bus.

B2: splitting, based on the rule for data changes, the path in B1 to obtain two or more functional safety splitting paths. Specifically, the segmented testing method of the present disclosure splits, based on the rule for data changes, the functional safety testing path 2 into three functional safety splitting paths, which are named as first functional safety splitting path Fusa2_p1, second functional safety splitting path Fusa2_p2, and third functional safety splitting path Fusa2_p3, respectively.

B3: obtaining the total number K of the functional safety splitting paths of the functional safety protection circuit, where K is a positive integer greater than or equal to 1. In the embodiment shown in FIG. 4, K is equal to three. Applying the functional safety testing mechanism on each functional safety splitting path to implement the functional safety testing circuit. More specifically, as shown in FIG. 4, a starting point of Fusa2_p1 coincides with that of the functional safety testing path 2 in a top-level module 20, that is, Fusa2_p1 and the functional safety testing path 2 have one common starting point. The common starting point is located at a point where the request is generated within the data reading modules 201. A testing point of Fusa2_p1 is located at a point within the compression state management module 206 where a content change of the request bus occurs. An ideal checksum value fusa2_d1_g of Fusa2_p1 is obtained based on data of the request bus (hereinafter, bus data) at the starting point of the functional safety testing path 2, and fusa2_d1_g corresponds to the request bus. The bus data obtained in the data reading modules 201 includes a request address and a request data size. The bus data is encoded when arriving at the compression state management module 206, where the request data size is changed, so as to obtain an actual checksum value fusa2_d1_a of the testing point of Fusa2_p1, fusa2_d1_g and fusa1_d2_a are then compared at the testing point, for purpose of protecting the request bus of Fusa2_p1.

Specifically, a starting point of Fusa2_p2 is a point within the compression state management module 206 where the request data size is changed, and a testing point of Fusa2_p2 is a point within the storage address mapping module 207 where the request address is changed. As the request data size of the request bus in Fusa2_p2 is changed, fusa2_d1_g of Fusa2_p1 may be released. An ideal checksum value fusa2_d2_g of Fusa2_p2 is obtained by re-encoding the bus data at the testing point of Fusa2_p1, and fusa2_d2_g may be released after being compared with an actual checksum value fusa2_d2_a of Fusa2_p2 at a testing point of Fusa2_p2.

Similarly, compared with Fusa2_p2, Fusa2_p3 has a different request address of the request bus. In the top-level module 20, an address bus of Fusa2_p3 is introduced with other request signals to be merged and protected, such as request signals for request type and request signals for request bus width, which are packed to form new protection data, so that an ideal checksum value fusa2_d3_g can be obtained at a starting point of Fusa2_p3. Fusa2_d3_g passes through the bus interface conversion module 205, and is configured to be compared with an actual checksum value fusa2_d3_a of Fusa2_p3 at an input interface of the top-level module 20. It should be noted that the interior of the bus interface conversion module 205 involves one or more cross-clock domain paths, and the checksum value and the bus data need to follow the same path to reach the testing point.

B4: collecting errors of the above three functional safety splitting paths, respectively, and combining the errors to obtain a final functional safety error of the functional safety protection circuit.

B5: applying the segmented testing method to other paths that require functional safety protection based on the steps and rules of B2 to B4. Specifically, in one embodiment as shown in FIG. 4, the functional safety testing path 3 is a data return pathway. The bus data passes through the bus interface conversion module 205 for cross-clock domain conversion, and then reaches a data reordering/deinterleaving processing module 204 to be reordered and compressed. The compressed data is transmitted to a data decompression module 203 to be decompressed and restored and then transmitted to the arbitration module 202, and finally returned to the data reading modules 201. The functional safety testing path 3 adopts a functional safety testing mechanism in a manner of cyclic redundancy check to protect the request bus.

Specifically, the segmented testing method of the present disclosure splits, based on both the rule for module boundaries and the rule for data changes, the functional safety testing path 3 into three functional safety splitting paths, which are named as first functional safety splitting path Fusa3_*p*1, second functional safety splitting path Fusa3_*p*2, and third functional safety splitting path Fusa3_*p*3, respectively. The functional safety testing path 3 is a path from the input interface of the top-level module 20 to an output interface of the data reading modules 201.

The functional safety testing path 3 is split, from the input interface of the top-level module 20 based on the rule for module boundaries, so as to generate new starting and testing points. On the premise that the system requirements for data source are met, actual data reaching one of the testing points will be encoded to obtain an actual checksum value, and then comparing it with an ideal checksum value from the data source, so as to determine whether the data reaching this testing point has an error flip. If the actual checksum value is consistent with the ideal checksum value, it indicates that the data does not have an error flip. The actual data will be re-encoded when arriving at the starting point of Fusa3_*p*1 to obtain another ideal checksum value, and then this another ideal checksum value will be compared with another actual checksum value at the testing point of Fusa3_*p*1. The encoding polynomial of the starting point can be redefined. The Fusa3_*p*1 may be implemented inside an IP circuit without depending on the system requirements for data source, and perform functional safety protection on IP interfaces and internal circuits.

Similarly, in the top-level module 20, the data is subjected to out-of-order processing, interleaving processing, and decompression processing. As the order of the data return pathway in the functional safety testing path 3 is changed multiple times, it's difficult to realize functional safety protection with a small area and a high coverage rate for the functional safety testing path 3. The segmented testing method proposed in the present disclosure solves this above problem.

Specifically, as shown in FIG. 4, the starting point of Fusa3_*p*1 coincides with that of the functional safety testing path 3 in the top-level module 20, and the testing point of Fusa3_*p*1 is located at an output interface of the bus interface conversion module 205. An ideal checksum value of Fusa3_*p*1 is obtained at the starting point of the functional safety testing path 3. It should be noted that, if the externally returned data has a check bit, an actual checksum value of Fusa3_*p*1 can be obtained by calculating the externally returned data at the starting point of the functional safety testing path 3, and then comparing it with the ideal value of Fusa3_*p*1. The segmented testing method of the present disclosure may also comprise Safety Elements out of Context (SEooC) to exclude random errors of the circuit in the top-level module 20. If the actual cyclic redundancy bit and the ideal checksum value at the starting point of the functional safety testing path 3 are consistent, it indicates that the data reaching the top-level module 20 is normal, and otherwise, the system reports an abnormal interruption of data. The ideal checksum value of Fusa3_*p*1 is calculated based on the actual data obtained at the starting point of Fusa3_*p*1. As the top-level module 20 has a plurality of data reading modules 201, there are multiple data return sources. And the checksum values of Fusa3_*p*1 may be merged or recombined based on characteristics of the externally returned data, not necessarily in accordance with the original value of the externally returned data. The actual data reaching an output interface of the data reordering/deinterleaving processing module 204 may be encoded in a manner of cyclic redundancy to obtain an actual checksum value. The actual checksum value is compared with the ideal checksum value, so as to determine whether there is an error.

Specifically, as shown in FIG. 4, a starting point of Fusa3_*p*2 is located at the data reordering/deinterleaving processing module 204, and a testing point of Fusa3_*p*2 is located at an output interface of the data decompression module 203. On the premise that the area target is allowed, Fusa3_*p*2 is protected in a manner of copying redundant modules, the data transmitted from the data reordering/deinterleaving processing module 204 is respectively input to the data decompression module 203 and copying modules thereof for safety testing protection. It should be noted that the functional safety testing mechanism of each path can adopt functional protection means with a more optimized area.

Similarly, in Fusa3_*p*3, the data to be protected is decompressed to reach a final use position. During this process, the data will not be changed, and can be protected by utilizing a cyclic redundancy check mechanism.

Collecting the errors of K functional safety splitting paths, respectively, which are sent to the final functional safety error interrupt signal. As shown in FIG. 4, the errors of K functional safety splitting paths are collected and merged, and finally sent to the error interrupt signal of the entire system.

Figure 5:
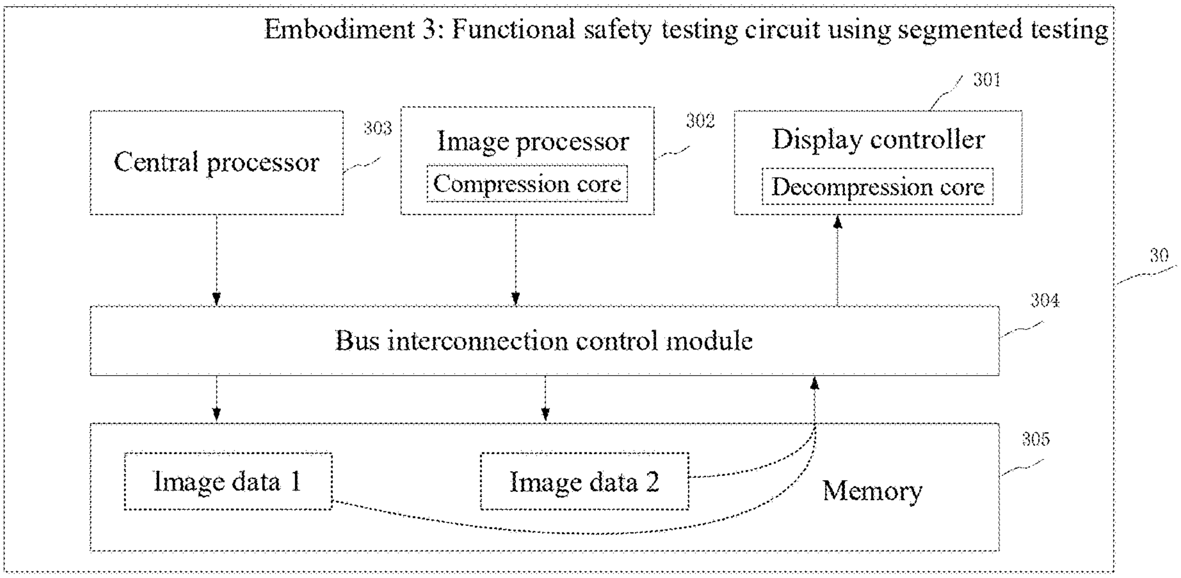
FIG. 5 shows a schematic circuit diagram of a segmented testing method for a functional safety testing circuit according to yet another embodiment of the present disclosure.

Please refer to FIG. 5, which shows a schematic circuit diagram of a segmented testing method for a functional safety testing circuit according to yet another embodiment of the present disclosure. FIG. 5 shows a top-level module 30 applying the segmented testing method of the present disclosure. The top-level module 30 comprises a SoC system provided with multiple IP circuits; the SoC system comprises a display controller 301, an image processor 302, a central processor 303, a bus interconnection control module 304, and a memory 305. In one embodiment, the IP circuits comprise two or more data pathways, and image data 1 generated by the central processor 303 and image data 2 generated by the image processor 302 are respectively transmitted to the display controller 301 through the data pathways.

Regarding the display controller 301, a data pathway requiring functional safety protection adopts a functional safety testing mechanism in a manner of cyclic redundancy check to protect a data bus. At the system level, the functional safety testing path has the following requirements: 1. the data source to be read must carry an ideal checksum value in the cyclic redundancy check, and the cyclic redundancy polynomial adopted by the ideal checksum value must be exactly the same as that of the testing point; 2. on the premise of a consistent cyclic redundancy polynomial, the ideal checksum value and the actual checksum value, which is generated by the actual data, have the same data order; 3. the content of the data must be exactly the same (in the top-level module 30, data sources on which a decompression path depends are compressed, and therefore if the data is not compressed by the same algorithm, the functional safety testing for the decompression path will be negatively affected). In the SoC system, the starting and testing points of the ideal checksum value involve different IP circuits. The above requirements enhance dependence between different IP circuits, thereby greatly reducing the flexibility of functional safety testing.

The segmented testing method of the present disclosure configures an input interface and output interface of each IP core in the SoC system such that they act as a starting point or a testing point of the functional safety splitting path. Whether the data comes from the central processor 303 or the image processor 302 does not affect the data pathway between the display controller 301 and the memory 305. The segmented testing method configures an input interface of the display controller 301 such that it acts as a starting point or a testing point for testing. When the input interface of the display controller 301 acts as the testing point, if the data sources meet the above three requirements of the system, the data is tested. Otherwise, the polynomial is defined at the input and output interfaces of the starting point through the display controller 301, and then re-encoded for testing, regardless of the data source. Similarly, other IP cores in the top-level module 30 also adopt the segmented testing method of the present disclosure, so as to functionally protect the data at input and output interfaces as well as IP circuits, thereby maximizing the end-to-end protection coverage rate. Therefore, the system meets the functional safety requirements.

The above segmented testing method greatly reduces the complexity of implementing functional safety testing circuits and improves flexibility of applying functional safety testing, while maintaining a coverage rate consistent with that of the entire functional safety testing path. This method achieves end-to-end functional safety protection, reduces system-level requirements, and provides new ideas for technical personnel in the field.

In several embodiments proposed in the present disclosure, the disclosed modules or methods can be implemented in other ways. For example, the division of modules or units described above is only illustrative and is only a logical functional division. In actual implementation, there may be other division methods, such as multiple modules or units can be combined or integrated into another system, or some features can be ignored or not executed. Here, the coupling or direct coupling or communication connection between each other can be indirect coupling or communication connection through some interfaces, devices, modules, or units, and can be electrical connection, mechanical connection, or other connections.

The modules or units shown as separate components can be physically separated or not. The components shown as modules or units can be physical modules or not. That is, they can be located in one place, or they can also be distributed to multiple network units. Some or all of the modules or units can be selected as needed to achieve the purpose of the corresponding embodiment. For example, in some embodiments of the present disclosure, each functional module or unit can be integrated into one processing module. Each functional module or unit can exist physically separately, or two or more modules or units can be integrated into one module or unit.

The ordinary technical personnel in this field should further realize that the units and algorithm steps of each example described in combination with the embodiments disclosed here can be implemented by electronic hardware, computer software, or a combination of both. In the above description, each example's composition and steps have been described generally based on functions, so as to clearly illustrate the interchangeability of hardware and software. Whether these functions are executed by hardware or software depends on the specific application and design constraints of the technical solution. Professional technicians can use different methods to implement the functions described for each specific situation, but such implementation should not be considered beyond the scope of the present disclosure.

The scope of the segmented testing method described in the present disclosure is not limited to the sequence of operations listed herein. Any scheme realized by adding or subtracting operations or replacing operations of the traditional techniques according to the principle of the present disclosure is included in the scope of the present disclosure.

Figure 6:
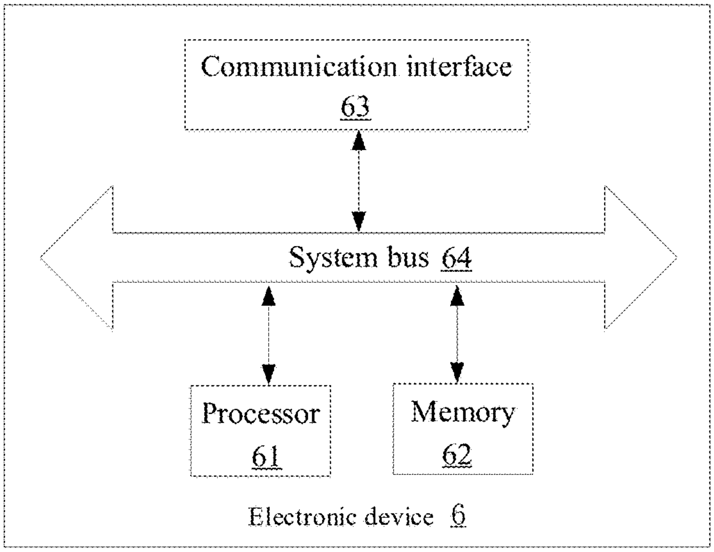
FIG. 6 shows a schematic structural diagram of an electronic device according to an embodiment of the present disclosure.

FIG. 6 shows a schematic structural diagram of an electronic device according to an embodiment of the present disclosure. As shown in FIG. 6, the electronic device 6 comprises a processor 61, a memory 62, a communication interface 63, and/or a system bus 64. The memory 62 and the communication interface 63 are connected through the system bus 64 and the processor 61 to complete communication with each other. The memory 62 is configured to store a computer program. The communication interface 63 is configured to communicate with other devices. The processor 61 is configured to run a computer program, so that the electronic device 6 executes various steps of the segmented testing method.

The processor 61 may be a general-purpose processor, for example, a central processing unit (CPU), a network processor (NP), etc.; it may also be a Digital Signal Processor (DSP), Application Specific Integrated Circuit (ASIC), Field-Programmable Gate Array (FPGA), other programming logic devices, discrete gates or transistor logic devices, or discrete hardware components.

The memory 62 may comprises Random Access Memory (RAM), or may also include non-volatile memory, such as at least one disk memory.

The system bus 64 mentioned above may be a Peripheral Component Interconnect (PCI) bus or an Extended Industry Standard Architecture (EISA) bus, etc. The system bus 64 can be divided into address bus, data bus, control bus, etc. The communication interface is used to implement communication between the database access device and other devices (such as a client, a read-write library, and a read-only library).

The present disclosure further provides a non-transitory computer-readable storage medium configured to store a computer program. Those skilled in the art can understand that, all or part of the steps in the method for implementing the above embodiments can be implemented when the computer program is executed by a processor. The non-transitory computer-readable storage medium may be, for example, random access memory, read-only memory, flash memory, hard disk, solid-state disk, magnetic tape, floppy disk, optical disc and any combination thereof. The above storage medium can be any available medium that can be accessed by a computer, or a data storage device that integrates one or more available media, such as a server, a data center, etc. The available medium can be a magnetic medium (such as a floppy disk, a hard disk, or a magnetic tape), an optical medium (such as a digital video disc (DVD)), or a semiconductor medium (such as a solid state disk (SSD)), etc.

The functional safety testing circuit described in the present disclosure adopts the above segmented testing method for testing.

In one embodiment, the functional safety testing circuit comprises a bus control module, a register parsing module, and a data processing module.

Referring again to FIG. 3, the configuration pathway that requires functional safety protection is connected to the input interface of the top-level module 10. The configuration pathway is first connected to the bus control module 101, which performs the bus interface protocol and transmits the configuration information of the configuration pathway to the register parsing module 102 to obtain parsed information of a register. The register parsing module 102 then sends the parsed information to the data processing module 103 to be processed by the data processing module 103. A final use position of the register is the testing point of the functional safety testing path 1 that requires functional safety protection, as shown in FIG. 3. The functional safety testing path 1 adopts a functional safety testing mechanism in a parity check mode to protect the configuration bus, compares the actual checksum value of actual data with the ideal checksum value of ideal data at the testing point of the functional safety testing path 1, and reports the functional safety error of the functional safety testing path 1 if the two are not consistent. In the implementation process, fusa1_*d*1_*g* of the functional safety testing path 1 is calculated based on the actual data obtained at the starting point of the functional safety testing path 1, that is, the input interface of the top-level module 10. Fusa1_*d*1_*g* needs to be transmitted, together with the original data timing, to the testing point of the functional safety testing path 1, that is, the data processing module 103. The actual data reaching the testing point of the functional safety testing path 1 is encoded to obtain fusa1_*d*1_*a*. Comparing fusa1_*d*1_*g* and fusa1_*d*1_*a* at the testing point, and reporting the functional safety error of the functional safety testing path 1 if the two are not consistent.

In another embodiment, the functional safety testing circuit comprises a data reading module, an arbitration module, a data decompression module, a reordering/deinterleaving processing module, a bus interface conversion module, a compression state management module and a storage address mapping module.

Referring again to FIG. 4, the functional safety testing path 2 is a data request pathway. A plurality of data reading modules 201 generate multiple data read requests, and send the multiple data read requests to the arbitration module 202. The arbitration module 202 chooses one request from the multiple data read requests and sends the chosen request to the compression state management module 206. The compression state management module 206 sends the chosen request to the storage address mapping module 207 after querying the data compression state corresponding to the chosen request. The storage address mapping module 207 maps the original virtual request address to the physical storage address to obtain the mapped physical storage address and the mapped request. The mapped physical storage address and mapped request are sent to the bus interface conversion module 205 for performing the bus interface protocol and the cross-clock domain conversion, and then sent to the bus. The functional safety testing path 2 adopts a functional safety testing mechanism in a parity check mode to protect the request bus.

The functional safety testing path 3 is a data return pathway. The bus data passes through the bus interface conversion module 205 for cross-clock domain conversion, and then reaches the data reordering/deinterleaving processing module 204 to be reordered and compressed. The compressed data is transmitted to the data decompression module 203 to be decompressed and restored and then transmitted to the arbitration module 202, and finally returned to the data reading modules 201. The functional safety testing path 3 adopts a functional safety testing mechanism in a manner of cyclic redundancy check to protect the request bus.

In yet another embodiment, the functional safety testing circuit comprises a SoC system provided with multiple IP circuits; the SoC system comprises a display controller, an image processor, a central processor, a bus interconnection control module, and a memory.

Referring again to FIG. 5, the IP circuits comprise two or more data pathways, and image data 1 generated by the central processor 303 and image data 2 generated by the image processor 302 are respectively transmitted to the display controller 301 through the data pathways. Regarding the display controller 301, the data pathway requiring functional safety protection needs to adopt a functional safety testing mechanism in a manner of cyclic redundancy check to protect the data bus.

The segmented testing method of the present disclosure configures the input and output interface of each IP core in the SoC system such that they act as the starting or testing point of the functional safety splitting path. Whether the data comes from the central processor 303 or the image processor 302 does not affect the data pathway between the display controller 301 and the memory 305. The segmented testing method configures the input interface of the display controller 301 such that it acts as the starting or testing point for testing. When the input interface of the display controller 301 acts as the testing point, if the data sources meet the requirements of the system, the data is tested. Otherwise, the polynomial is defined at the input and output interfaces of the starting point through the display controller 301, and then re-encoded for testing, regardless of the data source.

The description of the process or structure corresponding to each of the drawings has different emphases. For the parts that are not detailed in a certain process or structure, reference can be made to the relevant description of other processes or structures.

The above-mentioned embodiments are merely illustrative of the principle and effects of the present disclosure instead of limiting the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A segmented testing method for a functional safety testing circuit, comprising:

analyzing a circuit architecture of the functional safety testing circuit, and determining coverage paths of circuits that require functional safety protection;

splitting the functional safety testing circuit to obtain two or more segmented circuits based on the coverage paths by:

splitting the functional safety testing circuit by adopting one or more of a rule for module boundaries, a rule for data changes, or a rule for reducing a complexity of implementing the functional safety testing circuit, based on the coverage paths;

testing each of the two or more segmented circuits to obtain a circuit testing result by using a preset testing mechanism; and determining a functional safety error of the functional safety testing circuit based on the circuit testing result;

wherein when the functional safety testing circuit is split by adopting the rule for data changes based on the coverage paths, the rule for data changes comprises a change of data that requires functional safety protection and a change of verification data corresponding to the data that requires functional safety protection;

wherein the change of the data that requires functional safety protection comprises: a content change of the data and an increase or decrease in numbers of the data that requires functional safety protection when the data passes through an operation path; wherein the change of the verification data comprises a change of a verification polynomial and a change of a verification algorithm.

2. The method according to claim 1, wherein:

when the functional safety testing circuit is split by adopting the rule for module boundaries based on the coverage paths, the rule for module boundaries comprises a boundary of each submodule of modules and a module group consisting of the modules in the circuits that require functional safety protection.

3. The method according to claim 2, wherein adopting the rule for module boundaries comprises one or more of:

for an SRAM memory provided inside a module, configuring a submodule of the SRAM memory as a starting point and a testing point of a functional safety splitting path;

for a top-level input interface and a top-level output interface of an IP circuit, configuring the top-level input interface such that it corresponds to an earliest receiving terminal of the IP circuit, and configuring the earliest receiving terminal such that it is protected by the functional safety testing circuit and acts as a starting point of a functional safety protection circuit; configuring the top-level output interface such that it corresponds to an output sending terminal of the IP circuit, and configuring the output sending terminal such that it is protected by the functional safety testing circuit and acts as an ending point of the functional safety protection circuit;

in an SoC system where the IP circuit is provided, configuring an input interface and output interface of each IP core in the SoC system such that they act as a starting point or an ending point of the functional safety splitting path.

4. The method according to claim 1, wherein:

when the functional safety testing circuit is split by adopting the rule for reducing the complexity of implementing the functional safety testing circuit based on the coverage paths, the complexity of implementing the functional safety testing circuit comprises difficulties of transmitting an ideal checksum value from a starting point of a functional safety testing path of the functional safety testing circuit and then comparing the ideal checksum value at a testing point of the functional safety testing path.

5. The method according to claim 1, wherein analyzing the circuit architecture of the functional safety testing circuit and determining the coverage paths of the circuits that require functional safety protection comprises:

analyzing the circuit architecture of the functional safety testing circuit, and determining the coverage paths of circuits that require functional safety protection based on a functional safety target to be reached by the functional safety testing circuit, wherein each circuit of the circuits that requires functional safety protection comprises a control pathway and a data pathway.

6. The method according to claim 1, wherein determining the functional safety error of the functional safety testing circuit based on the circuit testing result comprises:

collecting the circuit testing result of each segmented circuit of the two or more segmented circuits; and determining the functional safety error of the functional safety testing circuit based on the circuit testing result of each segmented circuit.

7. An electronic device, comprising a processor and a memory, wherein the memory is configured to store a computer program, and the processor is configured to execute the computer program stored in the memory, so that the electronic device executes the method according to claim 1.

8. The electronic device according to claim 7, wherein splitting the functional safety testing circuit to obtain the two or more segmented circuits based on the coverage paths comprises:

splitting the functional safety testing circuit by adopting one or more of a rule for module boundaries, a rule for data changes, or a rule for reducing a complexity of implementing the functional safety testing circuit, based on the coverage paths.

9. The electronic device according to claim 8, wherein:

when the functional safety testing circuit is split by adopting the rule for module boundaries based on the coverage paths, the rule for module boundaries comprises a boundary of each submodule of modules and a module group consisting of the modules in the circuits that require functional safety protection.

10. The electronic device according to claim 9, wherein adopting the rule for module boundaries comprises one or more of:

for an SRAM memory provided inside a module, configuring a submodule of the SRAM memory as a starting point and a testing point of a functional safety splitting path;

for a top-level input interface and a top-level output interface of an IP circuit, configuring the top-level input interface such that it corresponds to an earliest receiving terminal of the IP circuit, and configuring the earliest receiving terminal such that it is protected by the functional safety testing circuit and acts as a starting point of a functional safety protection circuit; configuring the top-level output interface such that it corresponds to an output sending terminal of the IP circuit, and configuring the output sending terminal such that it is protected by the functional safety testing circuit and acts as an ending point of the functional safety protection circuit;

in an SoC system where the IP circuit is provided, configuring an input interface and output interface of each IP core in the SoC system such that they act as a starting point or an ending point of the functional safety splitting path.

11. The electronic device according to claim 8, wherein:

when the functional safety testing circuit is split by adopting the rule for data changes based on the coverage paths, the rule for data changes comprises a change of data that requires functional safety protection and a change of verification data corresponding to the data that requires functional safety protection;

the change of the data that requires functional safety protection comprises: a content change of the data and an increase or decrease in numbers of the data that requires functional safety protection when the data passes through an operation path; wherein the change of the verification data comprises a change of a verification polynomial and a change of a verification algorithm.

12. The electronic device according to claim 8, wherein:

when the functional safety testing circuit is split by adopting the rule for reducing the complexity of implementing the functional safety testing circuit based on the coverage paths, the complexity of implementing the functional safety testing circuit comprises difficulties of transmitting an ideal checksum value from a starting point of a functional safety testing path of the functional safety testing circuit and then comparing the ideal checksum value at a testing point of the functional safety testing path.

13. The electronic device according to claim 7, wherein analyzing the circuit architecture of the functional safety testing circuit and determining the coverage paths of the circuits that require functional safety protection comprises:

analyzing the circuit architecture of the functional safety testing circuit, and determining the coverage paths of circuits that require functional safety protection based on a functional safety target to be reached by the functional safety testing circuit, wherein each circuit that requires functional safety protection comprises a control pathway and a data pathway.

14. A non-transitory computer-readable storage medium, configured to store a computer program, wherein the method according to claim 1 is implemented when the computer program is executed by a processor.

15. The functional safety testing circuit, wherein the method according to claim 1 is applied for testing.

16. The functional safety testing circuit according to claim 15, wherein the functional safety testing circuit comprises a bus control module, a register parsing module, and a data processing module;

wherein a configuration pathway that requires functional safety protection is connected to the bus control module, wherein the bus control module is configured to perform a bus interface protocol and transmit configuration information of the configuration pathway to the register parsing module to obtain parsed information of a register, and the register parsing module then sends the parsed information to the data processing module to be processed by the data processing module, wherein a final use position of the register is configured as a testing point of a functional safety testing path.

17. The functional safety testing circuit according to claim 15, wherein the functional safety testing circuit comprises a plurality of data reading modules, an arbitration module, a data decompression module, a data reordering/deinterleaving processing module, a bus interface conversion module, a compression state management module and a storage address mapping module;

in a data request pathway, the data reading modules generate multiple data read requests and send the multiple data read requests to the arbitration module, the arbitration module chooses one request from the multiple data read requests and sends the chosen request to the compression state management module, the compression state management module sends the chosen request to the storage address mapping module after querying a data compression state corresponding to the chosen request, and the storage address mapping module maps an original virtual request address to a physical storage address to obtain a mapped physical storage address and a mapped request; wherein the mapped physical storage address and mapped request are sent to the bus interface conversion module for performing the bus interface protocol and a cross-clock domain conversion, and then sent to a bus;

in a data return pathway, after the cross-clock domain conversion through the bus interface conversion module, data reaches the data reordering/deinterleaving processing module to be reordered and compressed, the compressed data is transmitted to the data decompression module to be decompressed and restored and then transmitted to the arbitration module, and finally returned to the data reading modules; wherein a functional safety protection path that requires functional safety protection adopts a functional safety testing mechanism in a manner of cyclic redundancy check to protect a request bus.

18. The functional safety testing circuit according to claim 15, wherein the functional safety testing circuit comprises a SoC system provided with multiple IP circuits, the SoC system comprises a display controller, an image processor, a central processor, a bus interconnection control module, and a memory;

wherein the IP circuits comprise two or more data pathways, and image data generated by the central processor and image data generated by the image processor are respectively transmitted to the display controller through the data pathways.

* * * * *